(12) United States Patent
Jeong et al.

(10) Patent No.: US 9,496,357 B2
(45) Date of Patent: Nov. 15, 2016

(54) SEMICONDUCTOR DEVICE (75) Inventors: Yong Hun Jeong, Sarawak (MY); Bui Ngo Bong, Sarawak (MY); Yen Thing Tay, Sarawak (MY); Iliyana Manso, Sarawak (MY)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 14/233,835

(22) PCT Filed: Jul. 22, 2011

(86) PCT No.: PCT/EP2011/062665
§ 371 (c)(1),
(2), (4) Date: Apr. 29, 2014

(87) PCT Pub. No.: WO2013/013698
PCT Pub. Date: Jan. 31, 2013

(65) Prior Publication Data
US 2014/0231905 A1    Aug. 21, 2014

(51) Int. Cl.
| H01L 27/108 | (2006.01) |
| H01L 29/423 | (2006.01) |
| H01L 29/78 | (2006.01) |
| H01L 29/66 | (2006.01) |

(52) U.S. Cl.
CPC ..... *H01L 29/4236* (2013.01); *H01L 29/42368* (2013.01); *H01L 29/66734* (2013.01); *H01L 29/7813* (2013.01); *H01L 29/7827* (2013.01)

(58) Field of Classification Search
CPC ... H01L 21/336; H01L 21/76; H01L 27/148; H01L 29/1095; H01L 29/423; H01L 29/4236; H01L 29/42368; H01L 29/456; H01L 29/49; H01L 29/4925; H01L 29/4933; H01L 29/4941; H01L 29/66734; H01L 29/78; H01L 29/7813; H01L 29/782729
USPC ......... 257/341, 350, 401, E27.099, E27.027, 257/E27.066, E29.13, E29.26, E29.263, 257/E33.005, 21.12; 438/197, 41, 44, 222, 438/226, 245, 269, 300, 357, 363, FOR. 237
See application file for complete search history.

(56) References Cited

U.S. PATENT DOCUMENTS

| 5,701,026 | A | * | 12/1997 | Fujishima et al. ............ 257/510 |
| 6,030,881 | A | * | 2/2000 | Papasouliotis et al. ...... 438/424 |
| 6,265,269 | B1 | * | 7/2001 | Chen et al. .................... 438/270 |
| 6,882,000 | B2 | * | 4/2005 | Darwish et al. .............. 257/307 |
| 6,969,888 | B2 | * | 11/2005 | Williams ............. H01L 29/4236 257/330 |
| 7,005,351 | B2 | * | 2/2006 | Henninger et al. ........... 438/268 |
| 7,012,005 | B2 | * | 3/2006 | Lichtenberger et al. ..... 438/270 |
| 7,049,657 | B2 | * | 5/2006 | Matsuda ............. H01L 29/7813 257/333 |

(Continued)

OTHER PUBLICATIONS

International Search Report for corresponding application PCT/EP2011/062665 filed Jul. 22, 2011; Mail date Apr. 12, 2012.

(Continued)

*Primary Examiner* — Xinning Niu
*Assistant Examiner* — Vu A Vu
(74) *Attorney, Agent, or Firm* — Nixon & Vanderhye PC (57) ABSTRACT

A trench MOSFET including: an epitaxial layer; a body region on the epitaxial layer, the body region and the epitaxial layer forming a first interface; a trench; a trench bottom oxide in the trench; and polysilicon in the trench, the trench bottom oxide and the polysilicon forming a second interface; where the first and second interfaces are substantially aligned or are at substantially the same level.

10 Claims, 9 Drawing Sheets

(56) References Cited

U.S. PATENT DOCUMENTS

| | | | |
|---|---|---|---|
| 7,557,032 B2* | 7/2009 | Nejad et al. | 438/630 |
| 7,648,877 B2* | 1/2010 | Andrews | H01L 29/66734 |
| | | | 438/268 |
| 8,310,001 B2* | 11/2012 | Darwish et al. | 257/330 |
| 2003/0235958 A1* | 12/2003 | Chan et al. | 438/270 |
| 2004/0113202 A1* | 6/2004 | Kocon et al. | 257/330 |
| 2004/0173844 A1 | 9/2004 | Williams et al. | |
| 2004/0188756 A1 | 9/2004 | Matsuda | |
| 2006/0205222 A1* | 9/2006 | In't Zandt et al. | 438/700 |

OTHER PUBLICATIONS

Written Opinion for corresponding application PCT/EP2011/062665 filed Jul. 22, 2011; Mail date Apr. 12, 2012.

* cited by examiner

SEMICONDUCTOR DEVICE

This application claims priority to International Application No. PCT/EP2011/062665 filed Jul. 22, 2011, the entire contents of which are hereby incorporated by reference in this application.

TECHNICAL FIELD

The present invention relates to semiconductor devices such as high-frequency, high speed switching or power devices and a method of manufacturing the semiconductor devices. The invention particularly relates to trench MOSFETs, in particular to trench Power MOSFETs.

BACKGROUND

Power trench MOSFETs are widely used as switching devices in many electronic applications. A parameter in trench power MOSFETs is the total gate charge. In some applications of conventional trench power MOSFETs, such as DC-DC converters, the lower the gate charge the better the efficiency of the overall design. In switching applications a relatively high proportion of power loss is due to gate to drain capacitance (Miller capacitance). Thus an effective way to lower the Miller capacitance is to increase the thickness of the gate to drain dielectric.

Figure 1A:
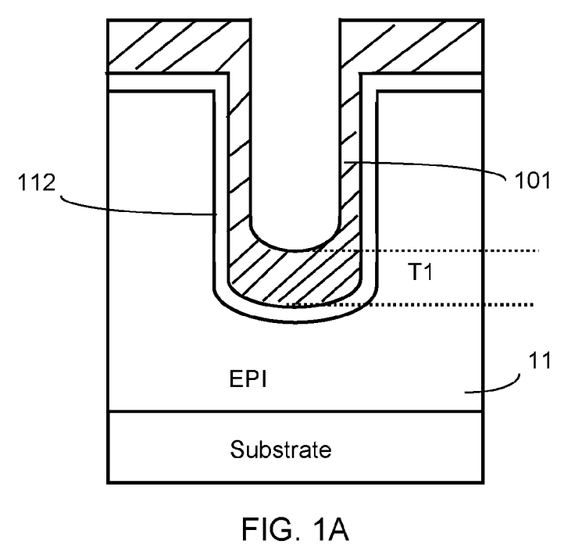
FIGS. 1A and 1B show a section through a conventional trench MOSFET at different stages in the manufacturing process.
Figure 1B:
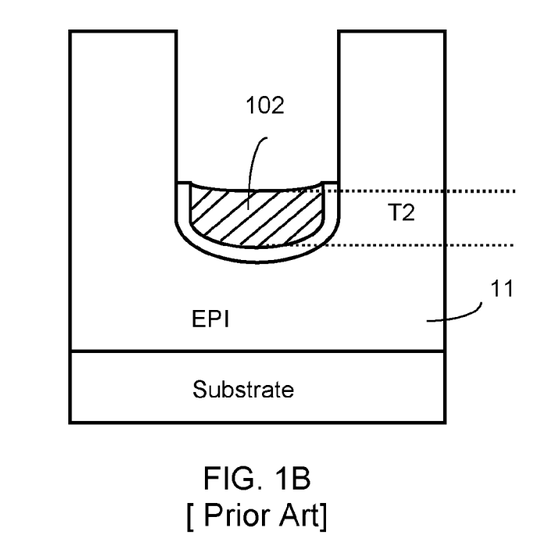
Figure 2:
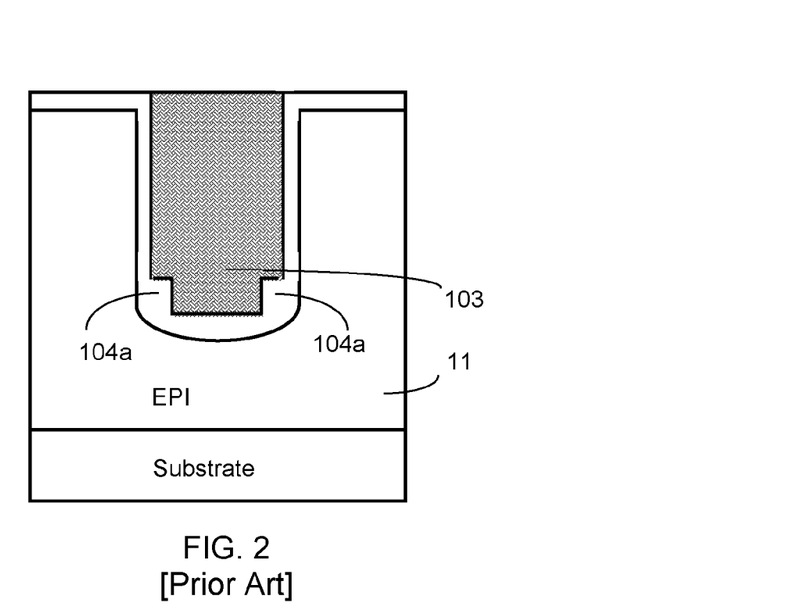
FIG. 2 shows a section through another conventional trench MOSFET.

FIG. 1A-1B and FIG. 2 are cross-sectional views illustrating prior art trench MOSFETs. As is known in the prior art, a trench 112 is provided and dielectric ions are then formed and directed downward into the trench 112 by means of an electric field. The result of this process is shown in FIG. 1A, where a dielectric layer 101 has been formed (as a result of the ions) inside and outside the trench. The dielectric layer 101 is thicker at the bottom of the trench than on the sidewalls of trench. As shown in FIG. 1B, the dielectric layer 101 is then etched back or clipped back to remove the portions on the sidewalls of the trench. The result is shown in FIG. 1B, where a gate insulator 102 remains on the bottom surface and a portion of the sidewall of the trench—also called the trench bottom oxide.

The inventors have appreciated a need to provide a (vertical) trench gate MOSFET employing a gate having an improved configuration to reduce gate-drain capacitance Cgd, and a method of manufacturing the same. The inventors have further appreciated a need to provide a trench MOSFET whose remaining bottom oxide can be made with good uniformity and reproducibility in terms of its thickness. The inventors have further appreciated a need to provide a high cell density, for example with a trench width of 0.2 μm or less.

BRIEF SUMMARY OF THE INVENTION

The present invention has been made with the above identified needs in mind. However, it is to be understood that not all embodiments necessarily satisfy all (or any) of the above needs.

(1) Certain embodiments provide the advantage of having a lower switching power loss, for example in DC-DC converter switching applications. In trench MOSFETs, a relatively large portion of the switching power loss may be due to Miller capacitance, which is a parasitic capacitance effect due to a rising drain current in the MOSFET active state. In order to decrease the Miller capacitance certain embodiments provide a gate to drain dielectric with an increased thickness. Certain embodiments also provide a method of manufacturing the desired thicker trench bottom oxide. Additionally, certain embodiments provide a second dielectric layer above the first dielectric layer in a central region of the trench gate (a convex thick bottom oxide).

(2) Certain embodiments provide the advantage of good uniformity and reproducibility for the remaining bottom oxide thickness. In the prior art case of FIG. 1A-1B it is difficult to control the bottom oxide thickness. Certain of the present embodiments provide a method of manufacturing the remaining bottom oxide of the trench gate with a uniform thickness.

(3) Certain embodiments provide the advantage of a lower specific on-resistance. The specific on-resistance is defined as the product of the on-resistance (Ron) of the MOSFET multiplied by the active area. As the cell density increases, the specific on-resistance becomes lower. Certain embodiments provide a method of manufacturing products with a high cell density due to a narrow trench width whilst ensuring that the trench is filled with the dielectric material.

(4) Certain embodiments provide the advantage of not needing new lithography processes. Certain embodiments provide a MOSFET whose gate to drain dimensions are determined in a self-aligning manner with a substantially constant gate to drain capacitance.

(5) Certain embodiments have the advantage that they enable the use of shorter channel lengths, without concern about punch-through breakdown, and this may result in a lower specific on-resistance and a significant reduction in the minority carrier diffusion current and reverse recovery charge Qrr when compared with conventional structures.

BRIEF DESCRIPTION OF THE DRAWINGS

Some embodiments of the invention will now be described by way of example only and with reference to the accompanying drawings, in which:

FIG. 5A to 5K show a section through the trench MOSFET of FIG. 3 at different stages in the manufacturing process.

DETAILED DESCRIPTION

One issue is uniformity of the thickness of the TBO. If the TBO thickness is not uniform, the threshold voltage Vth and the on-resistance value may be (very) unstable. In prior art devices such as shown in FIGS. 1A and 1B, the bottom oxide thickness T2 (FIG. 1B) corresponds to the deposited silicon oxide thickness T1 (FIG. 1A) so it is difficult to achieve uniformity of the thick bottom oxide thickness.

Certain embodiments of the present invention aim to optimize the relative position of what we will refer to as the "gate electrode bottom line" and the "BODY bottom line" in a trench gate Power MOSFET with thick bottom oxide (TBO). Depending on the configuration of the device, there may be a very small overlap between the silicon oxide deposited in the trench and a BODY region of the device. This small overlap may be defined as the height of the top of the silicon oxide deposited in the trench (the TBO)—the "gate electrode bottom line"—minus the height of the top of an epitaxial layer under the BODY region of the device (outside the trench)—the "BODY bottom line". Another possible definition for the overlap is the level of a first interface between the BODY region and the epitaxial layer when compared with the level of a second interface between polysilicon in the trench and the trench bottom oxide in the trench. Yet another possible definition for the overlap takes into account that the interfaces or the top of the silicon oxide deposited in the trench or the top of an epitaxial layer under the BODY region of the device may not define a plane. In this case the terms "height" or "top" may relate to only a portion of the "interface" or "top" of the respective regions/layers, for example the highest portion of these, or to that portion which is closest to the sidewall of the trench. Any such overlap should be kept sufficiently small so that the threshold voltage and/or On-resistance of the MOSFET is substantially not increased. Any such increase is preferably no more than 5% when compared with a MOSFET without overlap but of otherwise identical construction. In certain embodiments the overlap is less than about 25 nm.

In other embodiments of the present invention there is no overlap between the BODY region and the trench bottom oxide. Instead, the gate electrode bottom line and the BODY bottom line are at substantially the same level, or there is a distance between the BODY region and the trench bottom oxide.

Figure 3:
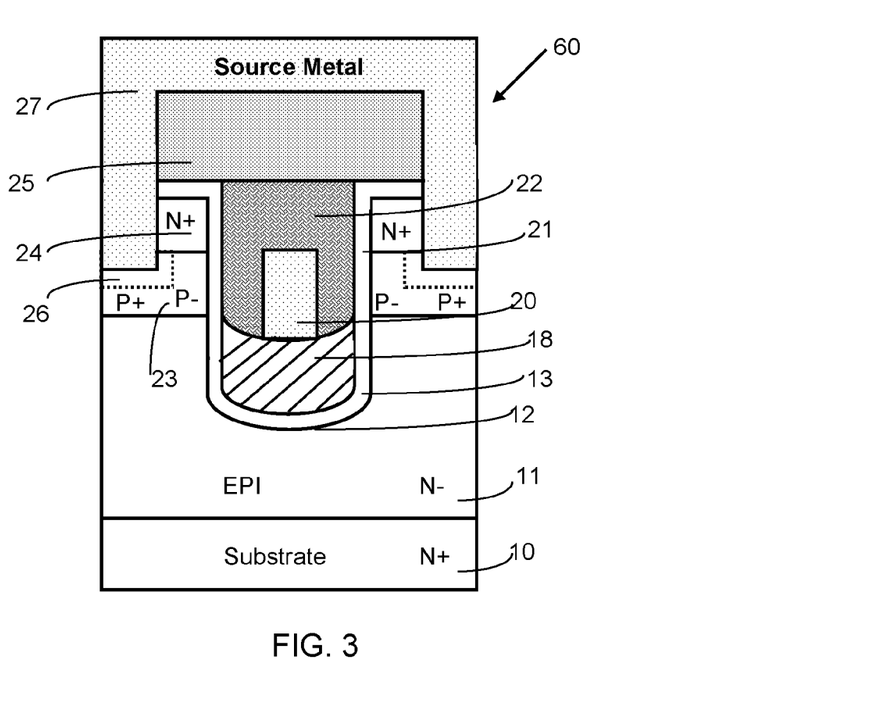
FIG. 3 shows a section through a trench MOSFET according to an embodiment of the present invention.
Figure 4A:
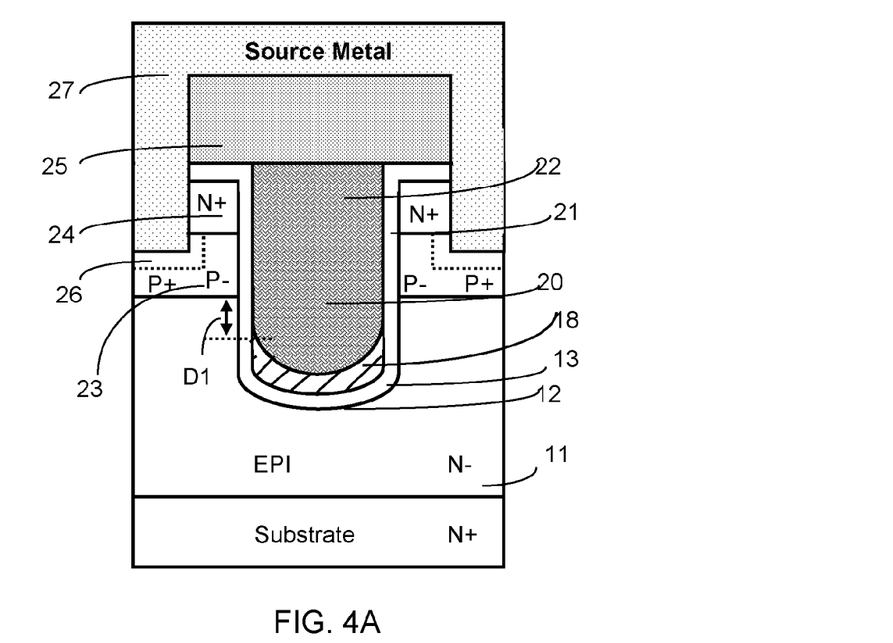
FIG. 4A shows a section through a modified version of the trench MOSFET of FIG. 3
Figure 4B:
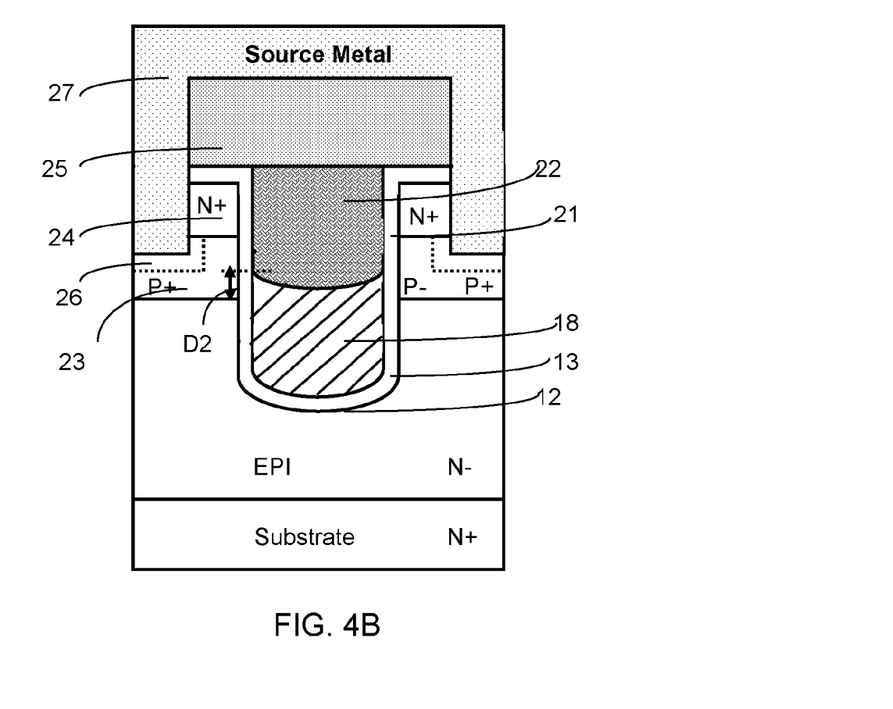
FIG. 4B shows a section through a modified version of the trench MOSFET of FIG. 3

FIGS. 4A and 4B illustrate the abovementioned overlap. Various details shown in FIGS. 4A and 4B will become clear from the discussion of FIG. 3 below. Suffice it to say at this stage that reference number 12 designates the trench, 18 the TBO, 22 the polysilicon material (which in the finished device becomes the gate electrode of the device), 23 the P BODY region and 11 the epitaxial layer. As shown in FIG. 4A, the interface between P BODY region 23 and epitaxial layer 11 is significantly higher—by a distance labelled D1—than the topmost point of the interface between polysilicon region 22 in the trench and the trench bottom oxide 18 in the trench. There is therefore no overlap between the gate electrode bottom line and BODY bottom line (or between P BODY region 23 and TBO 18). This also means that the bottom oxide thickness is relatively shallower, which in turn means that Qgd (Charge of Gate to Drain, related to Cgd) is not reduced.

Conversely, if there is a (substantial) overlap as indicated by D2 in FIG. 4B, the bottom oxide is relatively thick, in which case Vth and the on-resistance are (significantly) higher.

In order to reduce conduction loss it is possible to increase the cell density, but in that case the trench width also needs to be made narrower, in which case it is more difficult to control the bottom oxide thickness 102 (FIG. 1B) using prior art processes. In addition, it is difficult, if not impossible, to make the bottom oxide thicker than 2000 Angstrom (200 nm).

In relation to the above discussion it is believed that the terms "overlap" and "distance" will be understood by one skilled in the art. It will be appreciated that, while in the above discussion the terms "height" and "level" have been used, the invention is not restricted to devices in an upright orientation as shown in the figures. One possible way of determining the overlap or distance involves considering whether there is any overlap or distance between the P BODY region 23 and TBO 18 along a line defined by the trench side wall.

Turning to FIG. 2, this shows a prior art trench arrangement, which has a bottom oxide only at the side of the trench gate, as indicated by 104a. In this case the Qgd performance is not particularly good because the Qgd value is higher in the area without the thicker oxide at the trench gate 103, i.e. between side portions 104a.

It is usually desirable to manufacture MOSFETs with a short channel length. This is because the channel length is directly proportional to the on-resistance of the device. The channel length is defined by the width of the BODY region, and the total charge in the body region should normally remain high enough to prevent punch-through breakdown.

Embodiments of the present invention aim to address the above problems. At least some embodiments of the present invention include: substantially completely filling the trench with silicon oxide substantially without leaving a void in the trench gate, using a dual HDP (High Density Plasma) process, i.e. performing HDP, then CMP (Chemical Mechanical Polishing), then HDP to fill the remainder of the trench, then providing silicon nitride sidewalls and a $2^{nd}$ insulator. At least some embodiments use multi-chain BODY IMP (corresponding to Well Implantation in CMOS processes).

FIG. 3 is a cross-sectional view of one embodiment of a trench MOSFET 60 in accordance with the present invention. FIG. 5A to FIG. 5K are cross-sectional diagrams each showing a schematic structure of the embodiment of FIG. 3 at respective manufacturing steps to illustrate the fabrication sequence of the Trench MOSFET.

Figure 5A:
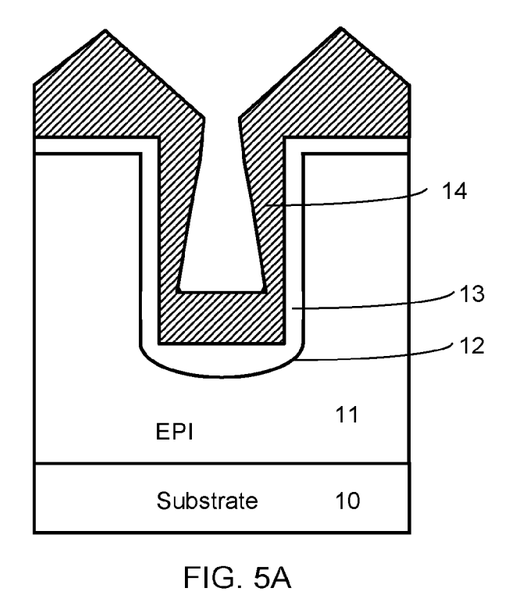

As shown in FIG. 5A, a substrate 10 (which subsequently becomes the drain in the completed device) with an epitaxial layer 11 thereon is provided. A trench 12 is formed in the epitaxial layer 11 by etching, and thereafter a surface PAD oxide (SiO2) 13 is thermally grown to a thickness of 3 to 10 nm. The following describes a process of forming the TBO in the vicinity of the bottom of the gate electrode. A silicon oxide layer 14 is deposited in the trench. Ideally, the silicon oxide layer is deposited so as to fully fill the trench gate using HDP, LP-TEOS (LP CVD, PECVD) and selective oxidation. However, it is difficult to completely fill in the trench gate, in particular in case the trench is relatively narrow (e.g. less than about 0.3 µm, 0.25 µm or 0.2 µm). A structure as shown in FIG. 5A may result, with a void at a central region of the trench and overhang portions at the corners of the trench.

Figure 5B:
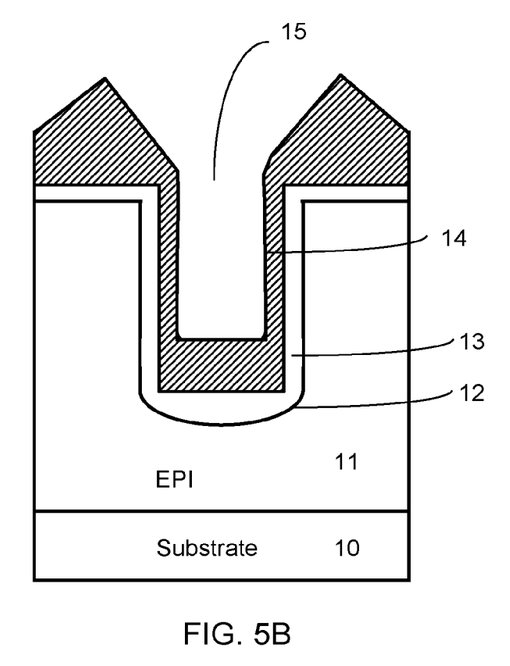
Figure 5C:
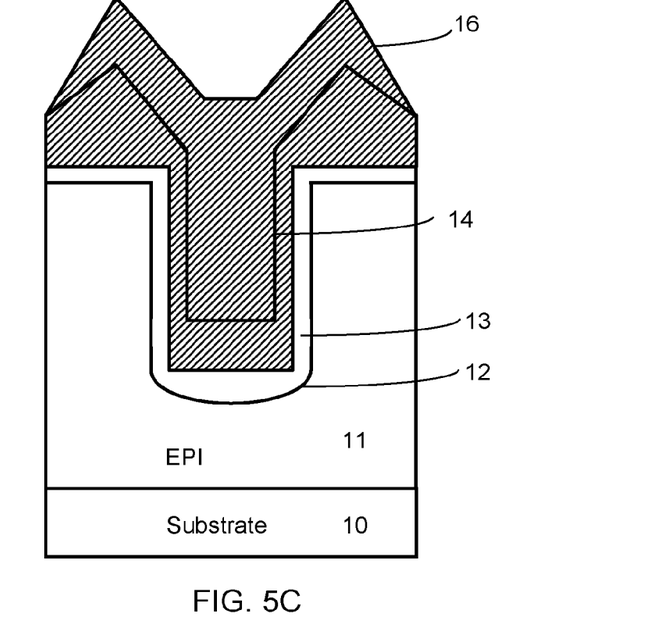

Referring to FIG. 5B, according to one embodiment, after the $1^{st}$ silicon oxide layer deposition, the silicon oxide layer 14 is subjected to anisotropic etching or Isotropic etching 15 so as to remove the overhang. As shown in FIG. 5C, a second deposit of silicon oxide 16 is carried out, and in this case it is easier to fully fill the gap.

Figure 5D:
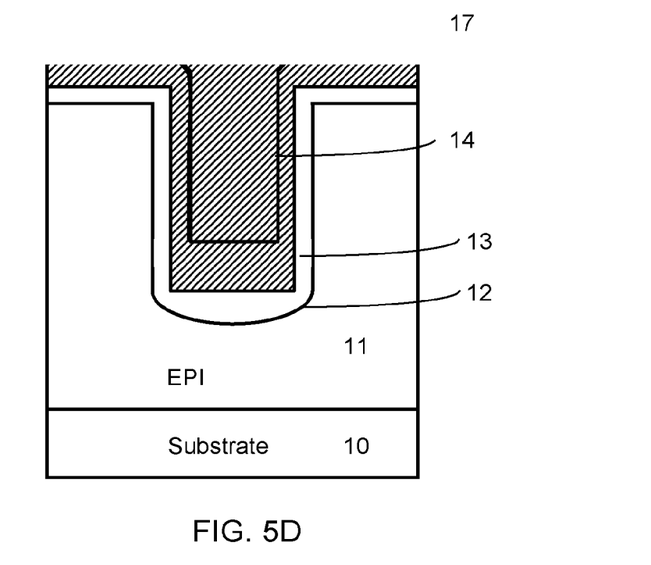

After densification and planarization of the silicon oxide layer(s) 14, 16 using anisotropic etching and Chemical Mechanical Polishing (CMP) 17, the structure of FIG. 5D is obtained.

Figure 5E:
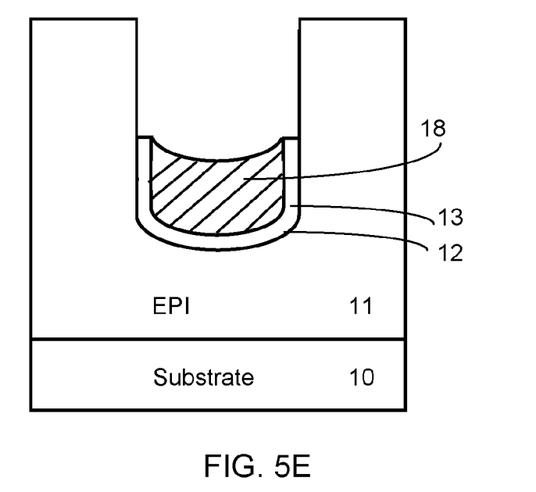

The silicon oxide layer(s) 14, 16 are then etched back or clipped back to remove portions on the sidewalls of the trench. The result of this process is shown in FIG. 5E, where the silicon oxide layer (now labelled 18) is relatively thick at the bottom of the trench. The silicon oxide layer is substantially or completely removed from the sidewalls of trench. If any silicon oxide remains on the sidewalls of trench, this is much thinner than the silicon oxide layer (now labelled 18) at the bottom of the trench. The device of this embodiment can be fabricated e.g. with a thickness of the trench bottom oxide 18 of more than 4000 or 5000 Angstroms (400 or 500 nm).

Figure 5F:
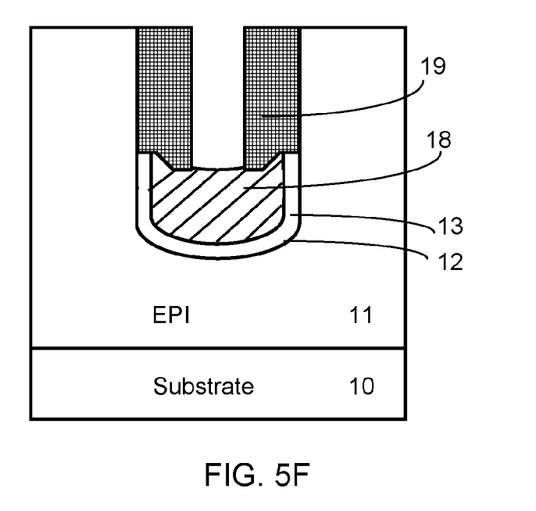

Next, referring to FIG. 5F, a spacer or a pair of spacers 19 is deposited in the trench, on silicon oxide layer 18 and extending to the top of the trench. The spacers 19 can for example be made using a silicon nitride layer. Normally, there would be two spacers 19, one on each side of the trench. The trench would normally be rectangular when seen from the top.

Figure 5G:
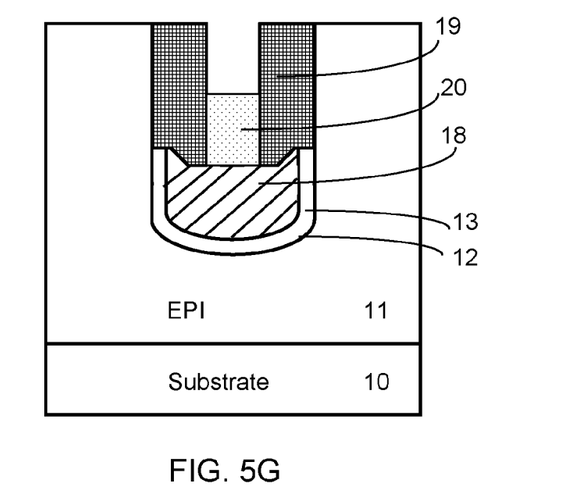

As shown in FIG. 5G, another silicon oxide portion 20 (or dielectric pole) using HDP, TEOS (LPCVD, PECVD) is deposited in the trench. This silicon oxide portion 20 is deposited between the spacers 19, in a central region of the trench. The silicon oxide portion 20 is deposited on silicon oxide layer 18 and may extend e.g. half-way along the spacer 19. Since the spacers 19 define the space available for silicon oxide portion 20, silicon oxide portion 20 can be made in a self-aligned manner. No additional lithography steps are required for making silicon oxide portion 20.

Figure 5H:
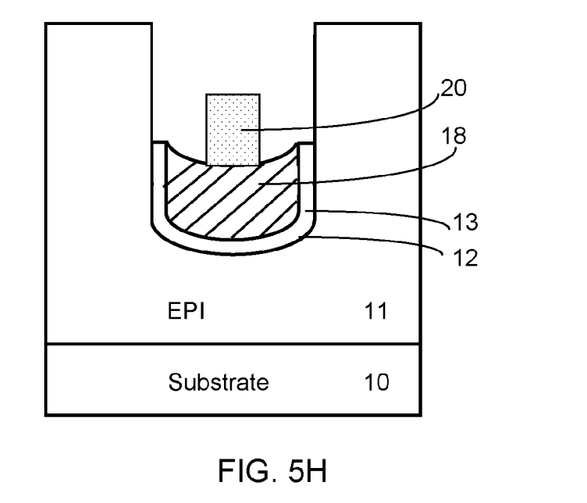

The silicon nitride sidewall spacers 19 are then removed, as shown in FIG. 5H. This leaves silicon oxide portion 20 located on silicon oxide layer 18, and together these form a convex thick bottom oxide.

Figure 5I:
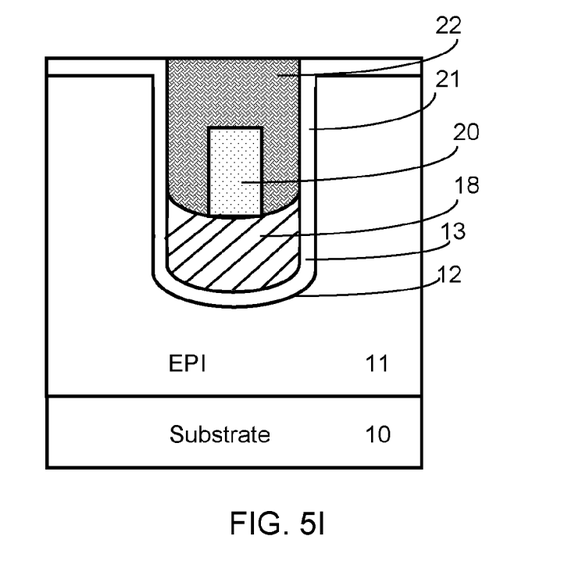
Figure 5J:
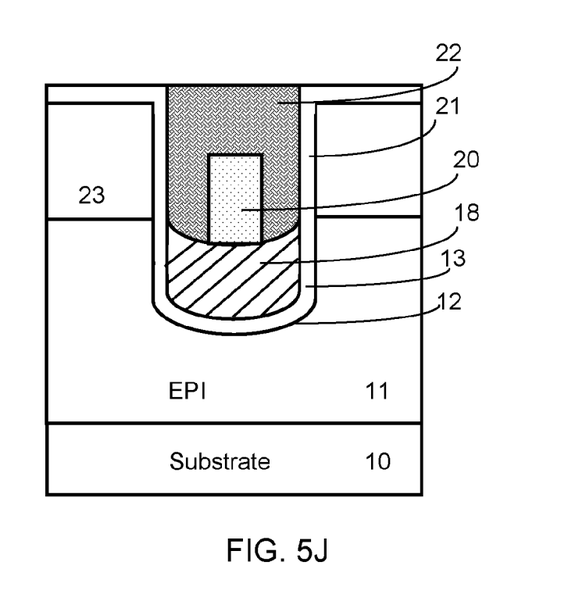

As shown in FIG. 5I, a thermal gate oxide layer 21 is then grown on the wafer top surface and the sidewalls of the trench. The trench is then filled with a polysilicon layer 22. The polysilicon layer is then etched back or CMP to the level of the top surface of the gate oxide 21. Further, as shown in FIG. 5J, a P-type dopant such as boron is implanted to form P body region 23. The implant is performed such that the interface between P body region 23 and the remaining epi layer 11 is at approximately the same level as the topmost portions of silicon oxide layer 18 (adjacent the sidewall of the trench). Parameters of the implant which determine how deep region 23 will be include the Implant Energy and dosage and further the well drive-in process temperature and time. By choosing appropriate values for these parameters it is possible to ensure that the interface between body region 23 and epi layer 11 is at (approximately) the same level as the interface between silicon oxide layer 18 and polysilicon layer 22. In some embodiments, the distance between silicon oxide layer 18 and P body region 23 is within 0.2 μm or 0.15 μm or 0.1 μm. In some other embodiments there may be a small overlap between silicon oxide layer 18 and P body region 23, but this would normally be kept sufficiently small so that it does substantially not increase the Vth and the On-resistance of the device, e.g. by no more than 5%.

Figure 5K:
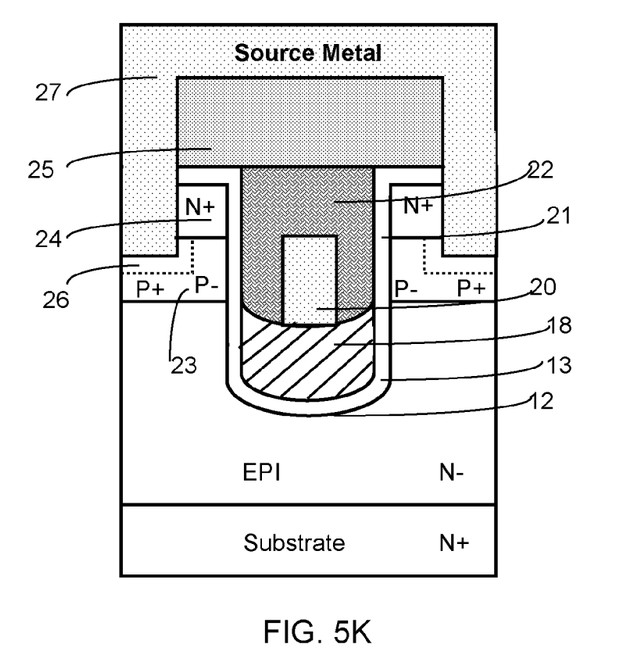

As shown in FIG. 5K, an N-type dopant such as arsenic or phosphorus is implanted to form N+source region 24, above P BODY region 23 and adjacent the oxide layer 21. A P+contact implant area is created in the outer regions of P BODY region 23. Another oxide layer 25 is deposited on the top surface of the device and patterned. The contact can then be filled by the top metal 27 or alternatively filled with a planarizing metal such as tungsten or with a barrier metal such as Ti/TiN.

Figure 6:
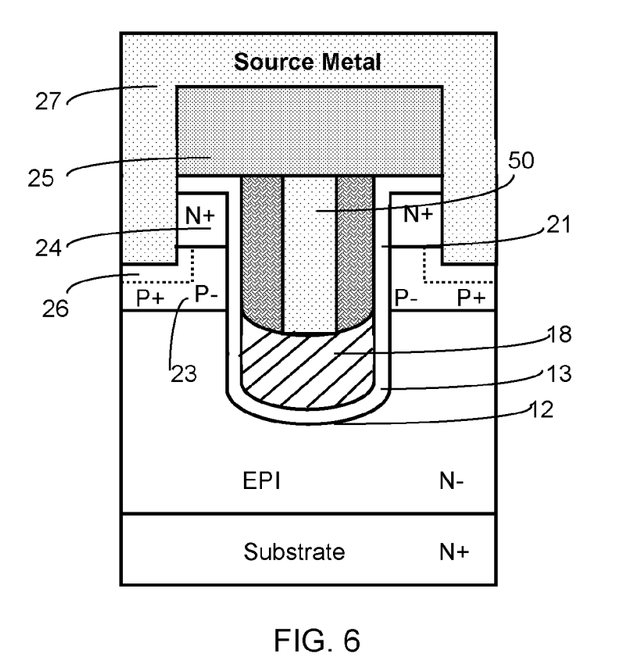
FIG. 6 shows a section through a trench MOSFET according to a further embodiment of the present invention.

A second embodiment is shown in FIG. 6. The processing steps correspond to those of FIG. 5A to 5K, but instead of the silicon oxide portion 20 of intermediate height (FIG. 5G) a silicon oxide 50 is inserted in the trench which reaches the top edge of the trench. In this embodiment the Qgd may be reduced even more than in the embodiment of FIG. 5A to 5K.

The skilled person will understand that in the preceding description and appended claims, positional terms such as 'on', 'above', 'overlap', 'under', 'lateral', 'vertical', etc. are made with reference to conceptual illustrations of a transistor, such as those showing standard cross-sectional perspectives and those shown in the appended drawings. These terms are used for ease of reference but are not intended to be of limiting nature. These terms are therefore to be understood as referring to a transistor when in an orientation as shown in the accompanying drawings.

It will be appreciated that all doping polarities mentioned or shown in this specification could be reversed, the resulting devices still being in accordance with the present invention.

Although the invention has been described in terms of embodiments as set forth above, it should be understood that these embodiments are illustrative only and that the claims are not limited to those embodiments. Those skilled in the art will be able to make modifications and alternatives in view of the disclosure which are contemplated as falling within the spirit and scope of the appended claims. Each feature disclosed or illustrated in the present specification may be incorporated in the invention, whether alone or in any appropriate combination with any other feature disclosed or illustrated herein.

The invention claimed is:

1. A trench MOSFET comprising:
   an epitaxial layer;
   a body region on the epitaxial layer, the body region and the epitaxial layer forming a first interface;
   a trench;
   a trench bottom oxide in the trench; and
   polysilicon in the trench, the trench bottom oxide and the polysilicon forming a second interface;
   wherein the first and second interfaces are substantially aligned or are at substantially the same level, such that an overlap between the body region and the trench bottom oxide is less than about 25 nm;
   wherein a surface of the trench bottom oxide which is in contact with polysilicon is convex;
   wherein the trench bottom oxide comprises a first trench bottom oxide portion occupying substantially the entire width of the trench, and a second trench bottom oxide portion directly on the first trench bottom oxide portion, the second trench bottom oxide portion occupying substantially less than the entire width of the trench;
   wherein the second trench bottom oxide portion occupies a central portion of the trench with respect to the width of the trench; and
   wherein the second trench bottom oxide portion extends to the top of the trench.

2. A trench MOSFET according to claim 1, wherein a laterally outer region of the second interface is at substantially the same level as a region of the first interface.

3. A trench MOSFET according to claim 1, wherein a region of the second interface which is immediately adjacent a sidewall of the trench is at substantially the same level as a region of the first interface.

4. A trench MOSFET according to claim 1, wherein the highest point of the second interface is at substantially the same level as a region of the first interface.

5. A trench MOSFET according to claim 1, wherein there is no overlap between the body region and the trench bottom oxide.

6. A trench MOSFET according to claim 1, wherein the distance between the body region and the trench bottom oxide along a line defined by the trench side wall is less than about 0.2 μm.

7. A trench MOSFET according to claim 1, wherein the overlap is an overlap between the body region and the trench bottom oxide along a line defined by the trench side wall.

8. A method of manufacturing a semiconductor device comprising:
   forming a first trench bottom oxide portion occupying substantially the entire width of a trench;
   forming at least one spacer in the trench and on the first trench bottom oxide portion; and thereafter
   forming a second trench bottom oxide portion on the first trench bottom oxide portion, the second trench bottom oxide portion occupying:
      substantially less than the entire width of the trench,
      a central portion of the trench with respect to the width of the trench,
      and extending to the top of the trench; and
   using the at least one spacer so as to form the second trench bottom oxide portion in a self-aligned manner.

9. The method according to claim 8, further comprising:
   introducing a conductive material into the trench to form an electrical connection for connecting to a gate electrode;
   forming a lightly-doped body region with an implanting process;
   forming a highly-doped source region with the opposite type of implant species to that of the body region;
   covering the gate electrode with a dielectric layer and depositing a metal layer being in electrical contact with the source region.

10. A trench MOSFET comprising:
    an epitaxial layer;
    a body region on the epitaxial layer, the body region and the epitaxial layer forming a first interface;
    a trench;
    a trench bottom oxide in the trench; and
    polysilicon in the trench, the trench bottom oxide and the polysilicon forming a second interface;
    wherein there is no overlap between the body region and the trench bottom oxide, and the distance between the body region and the trench bottom oxide along a line defined by the trench side wall is less than about 0.2 µm;
    wherein a surface of the trench bottom oxide which is in contact with polysilicon is convex;
    wherein the trench bottom oxide comprises a first trench bottom oxide portion occupying substantially the entire width of the trench, and a second trench bottom oxide portion directly on the first trench bottom oxide portion, the second trench bottom oxide portion occupying substantially less than the entire width of the trench;
    wherein the second trench bottom oxide portion occupies a central portion of the trench with respect to the width of the trench; and
    wherein the second trench bottom oxide portion extends to the top of the trench.

* * * * *